United States Patent
Nishiyama et al.

(10) Patent No.: US 9,570,197 B2
(45) Date of Patent: Feb. 14, 2017

(54) INFORMATION PROCESSING DEVICE, COMPUTER-READABLE RECORDING MEDIUM, AND METHOD

(71) Applicant: FUJITSU LIMITED, Kawasaki-shi, Kanagawa (JP)

(72) Inventors: Kimihiro Nishiyama, Kawasaki (JP); Daisuke Harada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 110 days.

(21) Appl. No.: 14/208,668

(22) Filed: Mar. 13, 2014

(65) Prior Publication Data
US 2014/0298109 A1    Oct. 2, 2014

(30) Foreign Application Priority Data
Mar. 29, 2013   (JP) .................. 2013-075356

(51) Int. Cl.
G06F 11/00   (2006.01)
G11C 29/10   (2006.01)
G06F 11/22   (2006.01)
G06F 11/10   (2006.01)
G06F 11/07   (2006.01)

(52) U.S. Cl.
CPC ............. *G11C 29/10* (2013.01); *G06F 11/073* (2013.01); *G06F 11/0751* (2013.01); *G06F 11/1044* (2013.01); *G06F 11/2215* (2013.01)

(58) Field of Classification Search
CPC .... G06F 11/2215; G06F 11/073; G11C 29/04; G11C 2029/0401; G11C 2029/0407; G11C 29/10
See application file for complete search history.

(56) References Cited

U.S. PATENT DOCUMENTS

| | | | | |
|---|---|---|---|---|
| 5,537,331 A | | 7/1996 | Shinonaga | |
| 5,604,755 A | * | 2/1997 | Bertin | ................... G06F 11/073 714/764 |
| 6,671,844 B1 | * | 12/2003 | Krech, Jr. | .............. G11C 29/56 714/736 |
| 8,028,207 B1 | * | 9/2011 | Villela | ................... G11C 29/08 713/2 |

(Continued)

FOREIGN PATENT DOCUMENTS

| | | |
|---|---|---|
| JP | 2-201564 | 8/1990 |
| JP | 2008-165772 | 7/2008 |

(Continued)

OTHER PUBLICATIONS

Extended European Search Report dated Sep. 4, 2014 in European Application No. 14160890.1-1954.

(Continued)

*Primary Examiner* — Yolanda L Wilson
(74) *Attorney, Agent, or Firm* — Staas & Halsey LLP

(57) ABSTRACT

An information processing device includes a plurality of memories, and a processor coupled to the plurality of memories and configured to carry out a first test to determine whether a first error is detected when first and second memories of the plurality of memories are concurrently operated, and when the first error is detected from the first test, carry out a second test to determine whether a second error is detected when the first and second memories are separately operated.

16 Claims, 10 Drawing Sheets

(56) References Cited

U.S. PATENT DOCUMENTS

| | | | |
|---|---|---|---|
| 9,117,552 B2* | 8/2015 | Lai | G11C 29/08 |
| 2002/0174381 A1 | 11/2002 | Olarig et al. | |
| 2003/0051193 A1* | 3/2003 | Pham | G06F 11/073 |
| | | | 714/42 |
| 2004/0243884 A1* | 12/2004 | Vu | G06F 11/073 |
| | | | 714/42 |
| 2005/0138506 A1* | 6/2005 | Stocken | G11C 29/56 |
| | | | 714/724 |
| 2006/0282751 A1* | 12/2006 | Passint | G06F 11/1004 |
| | | | 714/785 |
| 2008/0162991 A1 | 7/2008 | Dell et al. | |
| 2008/0163032 A1* | 7/2008 | Lastras-Montano | G06F 11/1044 |
| | | | 714/785 |
| 2009/0070630 A1* | 3/2009 | Khatri | G06F 11/073 |
| | | | 714/37 |
| 2010/0011261 A1* | 1/2010 | Cagno | G06F 11/1064 |
| | | | 714/719 |
| 2012/0131382 A1* | 5/2012 | Higeta | G06F 11/0724 |
| | | | 714/6.13 |
| 2012/0137167 A1* | 5/2012 | Leischner | G06F 11/073 |
| | | | 714/6.12 |
| 2012/0221923 A1 | 8/2012 | Uchibori | |
| 2014/0032984 A1* | 1/2014 | Lee | G11C 29/08 |
| | | | 714/718 |

FOREIGN PATENT DOCUMENTS

| | | |
|---|---|---|
| JP | 2010-537311 | 12/2010 |
| JP | 2012-177964 | 9/2012 |
| WO | 2009/025713 A1 | 2/2009 |

OTHER PUBLICATIONS

Japanese Office Action mailed Sep. 13, 2016 in related Japanese Application No. 2013-075356.

* cited by examiner

FIG. 4A

| PAIR OF DIMMS | ERROR INFORMATION |
|---|---|
| DIMM9a,DIMM10a | OK |
| DIMM9b,DIMM10b | NG |
| DIMM9c,DIMM10c | NG |

FIG. 4B

| DIMM | ERROR INFORMATION |
|---|---|
| DIMM9a | OK |
| DIMM9b | NG |
| DIMM9c | NG |
| DIMM10a | OK |
| DIMM10b | OK |
| DIMM10c | NG |

FIG. 5

| TIME STAMP | KIND OF ERROR | DOUBTED PORTION | ERROR CONTENT |
|---|---|---|---|
| 21-Dec-2012 22:48 | ERROR | MC3-DDR9-DIMM9a | MEMORY UNCORRECTABLE ERROR |
| 21-Dec-2012 22:48 | ERROR | MC3-DDR9-DIMM9b | MEMORY UNCORRECTABLE ERROR |
| 21-Dec-2012 22:48 | ERROR | MC3-DDR10-DIMM10b | MEMORY UNCORRECTABLE ERROR |

INFORMATION PROCESSING DEVICE, COMPUTER-READABLE RECORDING MEDIUM, AND METHOD

CROSS-REFERENCE TO RELATED APPLICATION

This application is based upon and claims the benefit of priority of the prior Japanese Patent Application No. 2013-075356, filed on Mar. 29, 2013, the entire contents of which are incorporated herein by reference.

FIELD

The embodiments discussed herein are related to an information processing device, a memory test program, and a memory test method.

BACKGROUND

There has been known an error detection and correction technique using error check and correction (ECC) as measures against errors in data stored in a dual inline memory module (DIMM). An example of such an error detection and correction technique is the single error correction/double error detection (SEC-DED) coding technique in which 8-bit ECC is added to 64-bit data to correct 1-bit error and detect two-bit error.

Moreover, there has been known a technique of increasing the number of bits of detectable errors without reducing the encoding ratio by concurrently operating a plurality of DIMMs using the memory lock step technology and by storing data and ECC in the DIMMs operated concurrently. For example, two DIMMs of a 72-bit width are concurrently operated and 128-bit data and 16-bit ECC are stored separately in the two DIMMs so that an S8EC (144, 128) code for detecting continuous 8-bit error is constructed. Related techniques are disclosed in Japanese National Publication of International Patent Application No. 2010-537311 and Japanese Laid-open Patent Publication No. 2012-177964.

SUMMARY

According to an aspect of the invention, an information processing device includes a plurality of memories, and a processor coupled to the plurality of memories and configured to carry out a first test to determine whether a first error is detected when first and second memories of the plurality of memories are concurrently operated, and when the first error is detected from the first test, carry out a second test to determine whether a second error is detected when the first and second memories are separately operated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A is a table to explain an example of error information;
FIG. 4B is a table to explain an example of a doubted DIMM specified result;
FIG. 5 is a table to explain an example of SEL point-out.

DESCRIPTION OF EMBODIMENTS

In the foregoing technique of concurrently operating a plurality of DIMMs, when an uncorrectable error occurs in a DIMM operated concurrently, it is difficult to specify the DIMM in which an error has occurred.

For example, when two DIMMs are concurrently operated using the memory lock step technology, if one DIMM fails where an uncorrectable error occurs, the failed DIMM is not specifiable because it is difficult to specify the DIMM in which the uncorrectable error has occurred. As a result, a normal DIMM may be specified as a failure component, and the fault using a failed DIMM may not be reproduced.

An object of the present disclosure is to specify a DIMM in which an uncorrectable error has occurred when a plurality of DIMMs are concurrently operated.

Hereinafter, embodiments of an information processing device, a memory test program, and a memory test method according to the present disclosure will be described in detail with reference to the accompanying drawings. These embodiments do not limit disclosed techniques. In addition, the embodiments may be combined within a scope having no inconsistency.

Embodiment 1

Figure 1:
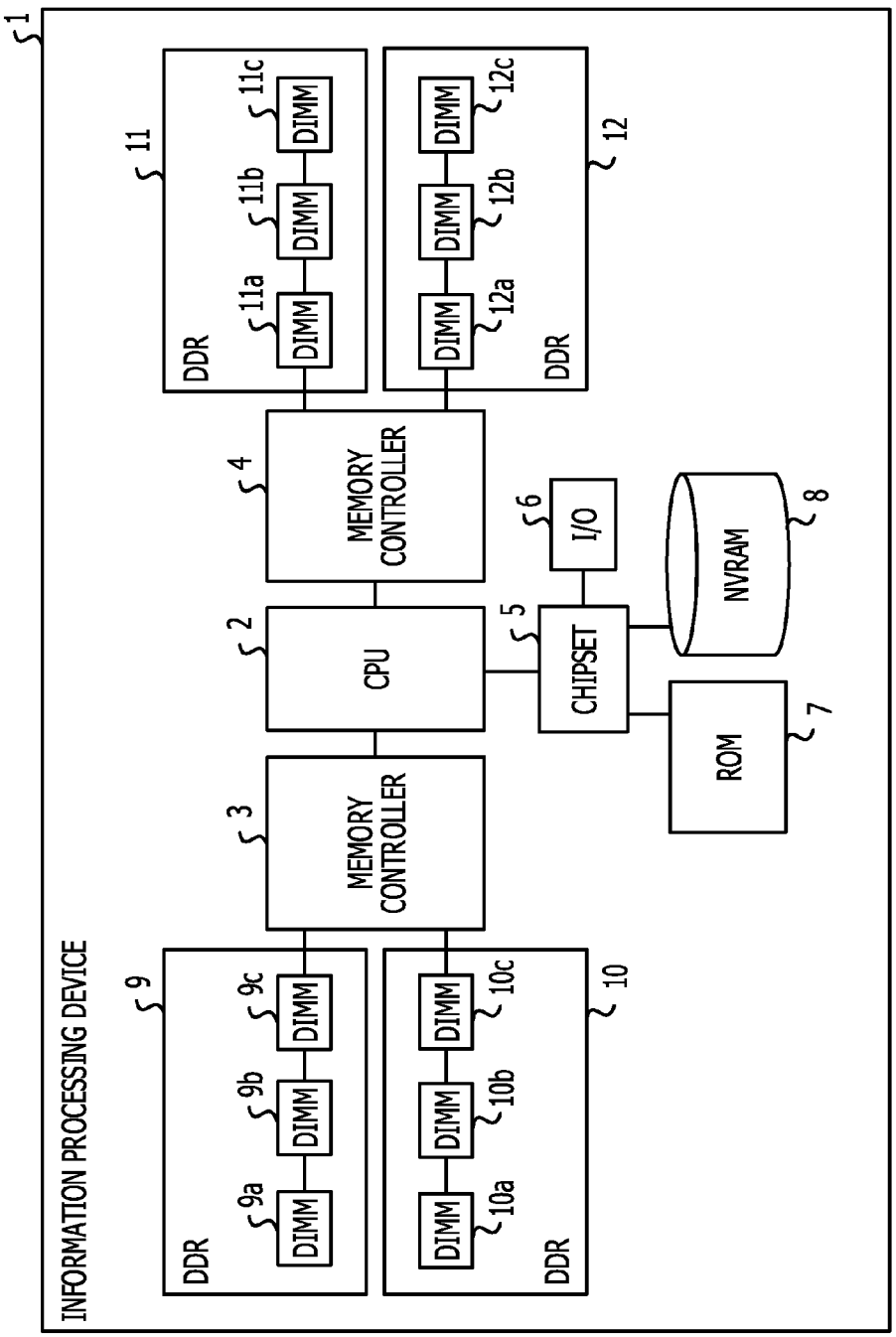
FIG. 1 is a diagram to explain an information processing device according to an embodiment 1.

In the following embodiment 1, an information processing device according to the present disclosure will be described with reference to FIG. 1. FIG. 1 is a diagram to explain an information processing device according to the embodiment 1. As illustrated in FIG. 1, an information processing device 1 includes a central processing unit (CPU) 2, a memory controller 3, a memory controller 4, a chipset 5, and an input/output (I/O) 6. Further, the information processing device 1 includes a read-only memory (ROM) 7 and a non-volatile random access memory (NVRAM) 8.

Furthermore, the information processing device 1 includes a plurality of double-data-rate synchronous dynamic RAMs (DDRs) 9 to 12 as a memory used for arithmetic processing. In this case, the DDR 9 is a DDR channel including a plurality of DIMMs 9a to 9c, and the DDR 10 is a DDR channel including a plurality of DIMMs 10a to 10c. Moreover, the DDR 11 is a DDR channel including a plurality of DIMMs 11a to 11c, and the DDR 12 is a DDR channel including a plurality of DIMMs 12a to 12c.

In the example depicted in FIG. 1, the information processing device 1 includes four DDRs 9 to 12, however, this embodiment is not limited to this example. The information processing device 1 may be provided with any number of DDRs. In addition, the information processing device 1 may be provided with the DIMMs 9a to 9c, 10a to 10c, 11a to 11c, and 12a to 12c as DIMMs, not as DDRs.

The CPU 2 is an arithmetic processor, which executes various arithmetic processes. For example, the CPU 2 executes a memory access to the DDRs 9 to 12 via the memory controllers 3 and 4, and then, executes arithmetic processes using data read from the DDRs 9 to 12. Further, the CPU 2 executes a data write operation to the DDRs 9 to 12.

Moreover, the CPU 2 accesses the I/O 6, the ROM 7, and the NVRAM 8 via the chipset 5 to execute data read and write operations. For example, the CPU 2 accesses an I/O device such as a hard disk drive (HDD) (not depicted) via the chipset 5 and the I/O 6 to execute data read and write operations. Further, the CPU 2 reads data from the ROM 7 via the chipset 5. Furthermore, the CPU 2 writes data to or reads data from the NVRAM 8 via the chipset 5.

The CPU 2 executes various programs to perform the foregoing arithmetic processes, memory accesses, and so on. For example, the CPU 2 executes a basic input/output system (BIOS) to carry out a test for each of the DDRs 9 to 12, and thereafter, executes an operating system (OS).

The memory controllers 3 and 4 execute issuance and control of a memory access to each of the DDRs 9 to 12. For example, when the memory controller 3 receives a read request including a logical address, the memory controller 3 executes a conversion of a logical address and a physical address. Further, the memory controller 3 acquires data from a storage area indicated by the converted physical address of storage areas included in the DDRs 9 and 10. The memory controller 3 outputs the acquired data to the CPU 2.

The memory controllers 3 and 4 are able to separately or concurrently operate each of the DIMMs 9a to 9c, 10a to 10c, 11a to 11c, and 12a to 12c included in the DDRs 9 to 12. For example, the memory controller 3 is able to concurrently operate the DIMMs 9a and 10a, the DIMMs 9b and 10b, and the DIMMs 9c and 10c. As described above, a state of concurrently operating a plurality of DIMMs is defined as a memory lock step mode in the following description.

Moreover, the memory controller 3 is able to independently operate each of the DIMMs 9a to 9c and 10a to 10c. As described above, a state of independently operating each DIMM is defined as an independent mode in the following description. Whether the memory controller 3 executes a memory access in the memory lock step mode or independent mode is designated by a BIOS executed when the CPU 2 starts up.

The chipset 5 executes transfer and control of various commands to the I/O 6, the ROM 7, and the NVRAM 8 from the CPU 2. In the example depicted in FIG. 1, the information processing device 1 includes one chipset 5; however, this embodiment is not limited to this example. For example, the information processing device 1 may be provided with a chipset operating as a north-bridge and a chipset operating as a south-bridge.

The I/O 6 is an input/output port for controlling a communication with various I/O devices. The ROM 7 is a read-only memory for storing various data used by the CPU 2; for example, the ROM 7 is stored with BIOS. The NVRAM 8 is a non-volatile memory; for example, any type of non-volatile memories such as an electrically erasable programmable ROM (EEPROM) and a flash memory.

Each of the DDRs 9 to 12 is a memory including one or more DIMMs. For example, the DDR 9 includes the DIMMs 9a to 9c each having 18 four-bit dynamic random access memories (DRAM).

When executing an OS and an application program, the information processing device 1 selects the memory lock step mode at the startup, and then, concurrently operates each of the DIMMs 9a to 9c, 10a to 10c, 11a to 11c, and 12a to 12c. For example, the information processing device 1 concurrently operates the DIMMs 9a and 10a.

Further, the information processing device 1 has a function, if a DRAM included in one DIMM fails and a data error occurs, of automatically correcting data stored in the failed DRAM. In the following description, the function of automatically correcting data stored in the failed DRAM is as a single device data correction (SDDC) function. The function same as above may be referred to as chipkill or extended ECC.

Figure 2:
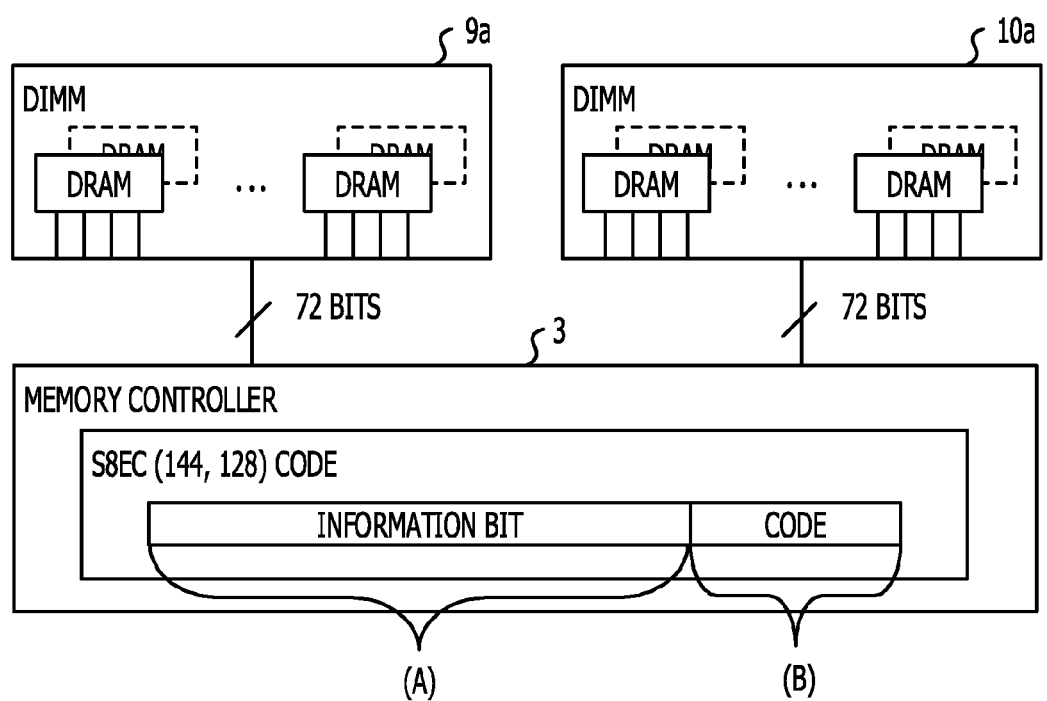
FIG. 2 is a diagram to explain an example of the structure of SDDC.

For example, if the DIMMs 9a to 9c include a 4-bit or 8-bit DRAM, the information processing device 1 encodes data using a single 8-bit error correct—double 8-bit error detect (S8EC-D8ED) (144, 128) code. With reference to FIG. 2, the S8EC-D8ED (hereinafter, simply described as S8EC) (144, 128) encoding will be described below.

FIG. 2 is a diagram to explain an example of the structure of SDDC. For example, the information processing device 1 regards 8 bits as a byte, and makes use of encoding using a Reed-Solomon code to generate from 128-bit data a 144-bit code word capable of correcting a continuous 8-bit error. Specifically, the information processing device 1 adds a 16-bit code capable of correcting a continuous 8-bit error illustrated in a part (B) of FIG. 2 to 128-bit data illustrated in a part (A) of FIG. 2 to generate a 144-bit code word. Further, the information processing device 1 stores the generated 144-bit code word in each of the DIMMs 9a and 10a by 72 bits.

In the case where the foregoing S8EC (144, 128) code is used, the information processing device 1 is able to correct 8-bit continuous error data. In other words, in the case where the information processing device 1 uses the S8EC (144, 128) code, if two 4-bit DRAMs or one 8-bit DRAM fails, the information processing device 1 is able to restore data stored in the failed DRAM from data stored in another DRAM.

According to an information processing device of the related art, when selecting the memory lock step mode, if an uncorrectable error occurs on concurrently operating DIMMs, the information processing device is not able to specify the DIMM of the concurrently operating DIMMs in which an uncorrectable error has occurred.

For example, an information processing device according to the related art having the same structure as the information processing device 1 generates a 144-bit code word using a S8EC (144, 128) code. Then, the information processing device according to the related art divides the generated data and stores the divided data in the DIMMs 9a and 10a operating in the memory lock step mode. If a DRAM included in the DIMM 9a fails and an error having 5-bit or more and 8-bit or less, that is, uncorrectable error occurs, the information processing device is not able to specify which of the DIMMs 9a and 10a has a failed DRAM.

In view of the foregoing circumstances, the information processing device 1 starts a BIOS, which allows the information processing device 1 to execute the following memory check procedure, at the startup, and executes the memory check procedure. First, the information processing device 1 determines whether or not a flag indicating that an uncorrectable error is detected is stored in the NVRAM 8 when the DIMMs 9a to 9c, 10a to 10c, 11a to 11c, and 12a to 12c are operated in the memory lock step mode.

If the flag is not stored in the NVRAM 8, the information processing device 1 selects the memory lock step mode and concurrently operates the DIMMs 9a and 10a, the DIMMs 9b and 10b, and the DIMMs 9c and 10c. Further, the information processing device 1 concurrently operates the DIMMs 11a and 12a, the DIMMs 11b and 12b, and the DIMMs 11c and 12c.

The information processing device 1 generates a 144-bit code word using a S4EC code and stores the generated data in each pair of DIMMs operating concurrently. Then, the information processing device 1 reads data stored in each pair of DIMMs to execute an error check. If an uncorrectable error is detected as a result of the error check, the information processing device 1 stores information indicating that an uncorrectable error is detected in the memory lock step mode in the NVRAM 8. Specifically, the information processing device 1 associates information indicating whether or not an uncorrectable error is detected with information indicating a pair of DIMMs, and stores the associated information in the NVRAM 8. Then, the information processing device 1 restarts.

The restarted information processing device 1 again determines whether or not a flag indicating that an uncorrectable error is detected is stored in the NVRAM 8. If the flag indicating that an uncorrectable error is detected is stored in the NVRAM 8, the information processing device 1 selects the independent mode and carries out a memory test for each DIMM. Specifically, the information processing device 1 identifies in the NVRAM 8 the information indicating the pair of DIMMs associated with the information indicating that an uncorrectable error is detected. Then, the information processing device 1 carries out an independent memory check with respect to each of DIMMs included in the pair indicated by the identified information.

For example, in the case where information indicating a pair of DIMMs 9a and 10a is associated with information indicating that an uncorrectable error is detected, and stored in the NVRAM 8, the information processing device 1 performs an independent memory check with respect to each of the DIMMs 9a and 10a. Specifically, for example, the information processing device 1 stores a code word encoded using a S4EC code in each of the DIMMs 9a and 10a. Then, the information processing device 1 reads data stored in each of the DIMMs 9a and 10a, and executes an error check.

If an uncorrectable error is detected from the DIMM 9a, the information processing device 1 outputs information that the DIMM 9a fails. If an uncorrectable error is detected from the DIMM 10a, the information processing device 1 outputs information that the DIMM 10a fails. Furthermore, if an uncorrectable error is detected from both of the DIMMs 9a and 10a, the information processing device 1 outputs information that both of the DIMMs 9a and 10a fail.

As a result, the information processing device 1 is able to specify the DIMM in which an uncorrectable error has occurred due to a failure of a DRAM, thereby keeping a normal DIMM from being regarded as a failed component. In addition, the information processing device 1 is able to specify a failed DIMM. Accordingly, for example, when a fault is reproduced using a failed DIMM, it is possible to avoid reproduction of fault using an erroneous DIMM, that is, a normal DIMM; therefore, this serves to improve reproducibility when a fault occurs.

If an uncorrectable error is not detected from both of the DIMMs 9a and 10a, the information processing device 1 outputs information that both of the DIMMs 9a and 10a fail. In other words, the information processing device 1 independently carries out a test with respect to each DIMM included in a pair of DIMMs, in which an uncorrectable error occurs in the memory lock step mode. In this case, if the occurrence of an uncorrectable error is not reproduced, the information processing device 1 notifies that both DIMMs fail. Therefore, the information processing device 1 is able to notify a user of DIMMs having a possibility of fail, for example.

Figure 3:
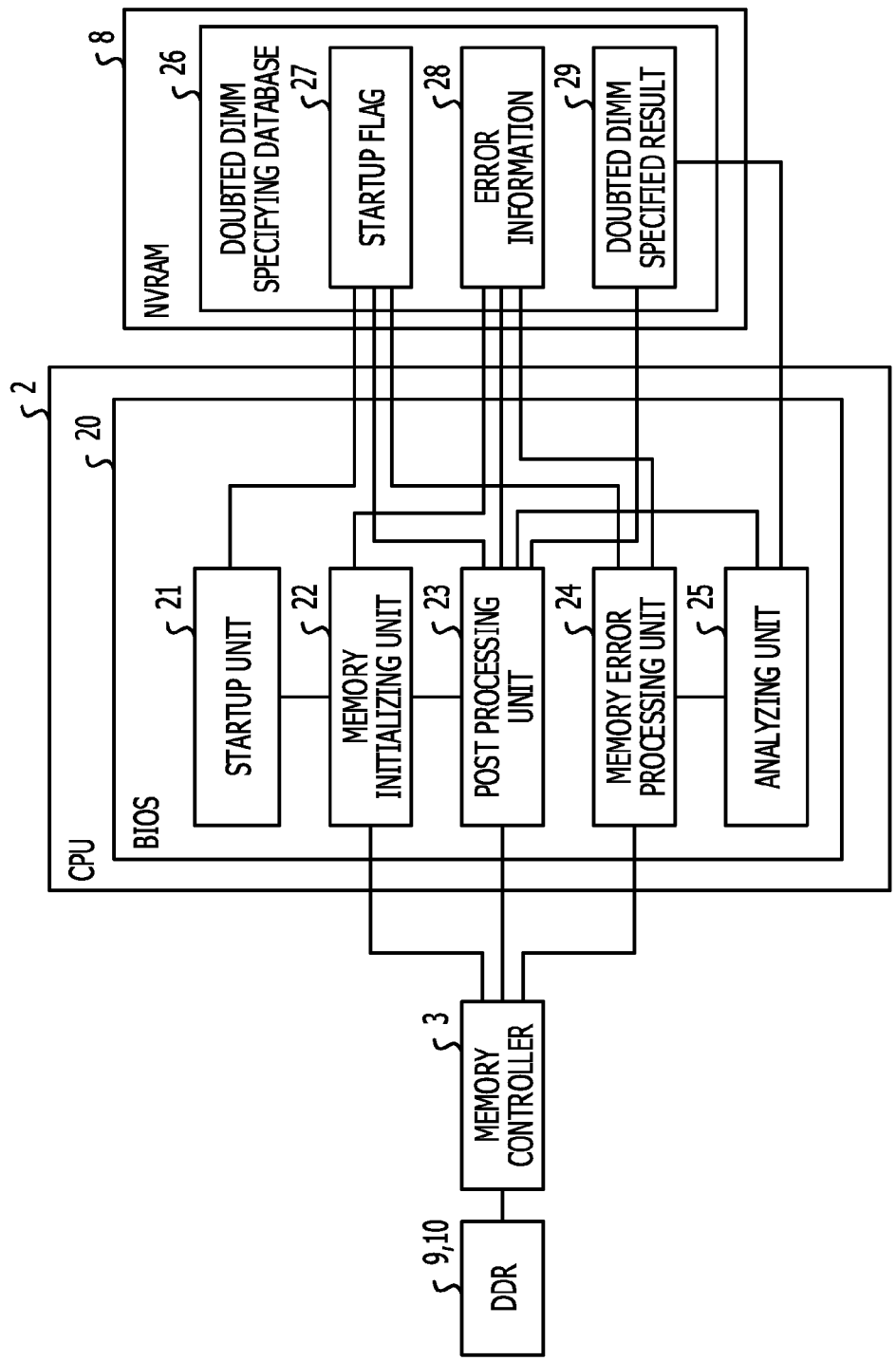
FIG. 3 is a diagram to explain the functional structure of a BIOS.

With reference to FIG. 3, the functional structure of a BIOS executed by the information processing device 1 will be described below. FIG. 3 is a diagram to explain the functional structure of a BIOS. FIG. 3 illustrates an example in which the CPU 2 reads a BIOS 20 stored in the ROM 7 and executes the read BIOS 20. In the following description, an example in which the CPU 2 executing the BIOS 20 accesses the DDRs 9 and 10 via the memory controller 3 is described. However, this embodiment is not limited to the example. In other words, the CPU 2 executing the BIOS 20 executes the same procedure as above with respect to the DDRs 10 and 11 via the memory controller 4.

For example, in the example illustrated in FIG. 3, the CPU 2 executing the BIOS 20 operates as a startup unit 21, a memory initializing unit 22, a power on self test (POST) processing unit 23, a memory error processing unit 24, and an analyzing unit 25. Moreover, a doubted DIMM specifying database 26 is stored in the NVRAM 8. The doubted DIMM specifying database 26 stores a startup flag 27, error information 28, and a doubted DIMM specified result 29.

The startup flag 27, the error information 28, and the doubted DIMM specified result 29 stored in the doubted DIMM specifying database 26 will be described. The startup flag 27 is a flag indicating whether or not an uncorrectable error is detected when a memory test is carried out in the memory lock step mode. For example, the value "1" of the startup flag 27 indicates that an uncorrectable error is detected when a memory test is carried out in the memory lock step mode. On the other hand, the value "0" of the startup flag 27 indicates that an uncorrectable error is not detected when a memory test is carried out in the memory lock step mode.

The error information 28 is information indicating a pair of DIMMs in which an uncorrectable error is detected when a memory test is carried out in the memory lock step mode. For example, FIG. 4A is a table to explain an example of error information. As illustrated in FIG. 4A, information on a pair of DIMMs and error information indicating whether or not an uncorrectable error is detected are associated and stored as the error information 28.

For example, in the example depicted in FIG. 4A, the error information 28 is stored in which error information "OK" indicating that an uncorrectable error is not detected is associated with the pair of DIMMs 9a and 10a. Therefore, the error information 28 indicates that an uncorrectable error is not detected in the pair of DIMMs 9a and 10a. Further, the error information 28 is stored in which error information "NG" indicating that an uncorrectable error is detected is associated with the pair of DIMMs 9b and 10b and the pair of DIMMs 9c and 10c. Therefore, the error information 28 indicates that an uncorrectable error is detected in the pair of DIMMs 9b and 10b and the pair of DIMMs 9c and 10c.

Returning to FIG. 3, the doubted DIMM specified result 29 is information individually indicating a DIMM of the DIMMs 9a to 9c and 10a to 10c, in which an uncorrectable error is detected. With reference to FIG. 4B, an example of the doubted DIMM specified result 29 will be described below. FIG. 4B is a table to explain an example of the doubted DIMM specified result.

In the example of FIG. 4B, the doubted DIMM specified result 29 is stored in which each of the DIMMs 9a to 9c and 10a to 10c and error information, are associated. In other words, when the information processing device 1 carries out a memory check in the independent mode, the doubted DIMM specifying database 26 stores error information indicating whether or not an uncorrectable error is detected in the DIMMs 9a to 9c and 10a to 10c. For example, if an uncorrectable error is detected in the DIMM 9b, the doubted DIMM specifying database 26 stores error information "NG" associated with information indicating the DIMM 9b.

Returning to FIG. 3, the startup unit 21 accesses the doubted DIMM specifying database 26 to determine whether or not the startup flag 27 is set. Then, if the startup flag 27 is not set, the startup unit 21 selects the memory lock step mode as a memory mode. If the startup flag 27 is set, the startup unit 21 selects the independent mode as the memory mode.

For example, if the value of the startup flag 27 is "0", the startup unit 21 selects the memory lock step mode as a memory mode. On the other hand, if the value of the startup flag 27 is "1", the startup unit 21 selects the independent mode as a memory mode. The doubted DIMM specifying database 26 informs the memory initializing unit 22 of the selected memory operation mode.

The memory initializing unit 22 sets a memory mode. Further, the memory initializing unit 22 validates an ECC function of the CPU 2. In accordance with the set memory mode and the startup flag 27, the memory initializing unit 22 informs the POST processing unit 23 of a target DIMM of a POST procedure, which is a memory test carried out at the startup of the information processing device 1.

For example, the memory initializing unit 22 receives a notification of the memory lock step mode or independent mode as a memory operation mode from the startup unit 21. When receiving the notification, the memory initializing unit 22 stores data indicating the memory lock step mode or independent mode in an ECC error status register of the memory controller 3 to set a memory mode.

In another example, if the CPU 2 is Core i7® series manufactured by the Intel Corporation, the memory initializing unit 22 may execute the following procedure to set a memory operation mode. That is, the memory initializing unit 22 changes the value of an LS_EN bit, which is a first bit of a MC memory technology register (MCMTR) to set a memory mode. Further, the memory initializing unit 22 changes the value of an ECC_EN bit, which is a second bit of the MCMTR, for example, to validate an ECC function.

When setting the memory lock step mode, the memory initializing unit 22 instructs the POST processing unit 23 to carry out a memory test with respect to each DIMM. On the other hand, when setting the independent mode, the memory initializing unit 22 identifies a pair of DIMMs in which an uncorrectable error is detected in the memory lock step mode. Specifically, the memory initializing unit 22 refers to the error information 28 to identify a pair of DIMMs associated with error information "NG".

Then, the memory initializing unit 22 instructs the POST processing unit 23 to carry out a memory test with respect to each DIMM included in the identified pair of DIMMs. For example, if information indicating the pair of DIMMs 9b and 10b is associated with error information "NG" in the error information 28, the memory initializing unit 22 instructs the POST processing unit 23 to carry out a memory test with respect to the DIMMs 9b and 10b.

If the memory lock step mode is set, the POST processing unit 23 executes a memory test with respect to each pair of DIMMs. Further, if the independent mode is set, the POST processing unit 23 independently executes a memory test with respect to each DIMM included in a pair of DIMMs in which an uncorrectable error is detected when carrying out a memory test in the memory lock step mode.

For example, if the memory initializing unit 22 sets a memory mode to the memory lock step mode, the POST processing unit 23 is instructed to execute a POST procedure with respect to each pair of DIMMs from the memory initializing unit 22. In such a case, the POST processing unit 23 executes a memory test with respect to the pair of DIMMs 9a and 10a, the pair of DIMMs 9b and 10b, and the pair of DIMMs 9c and 10c in the memory lock step mode.

If an uncorrectable error is detected as a result of the memory test, the POST processing unit 23 sets the value of the startup flag 27 to "1". Thereafter, the POST processing unit 23 stores the error information 28 associating information indicating a pair of DIMMs in which an uncorrectable error is detected with error information "NG" in the doubted DIMM specifying database 26. In other words, the POST processing unit 23 stores a pair of DIMMs in which an uncorrectable error is detected in the doubted DIMM specifying database 26 as a doubted DIMM.

Further, the POST processing unit 23 stores the error information 28 associating information indicating a pair of DIMMs in which an uncorrectable error is not detected with error information "OK" in the doubted DIMM specifying database 26. If an uncorrectable error is not detected as a result of the memory test, the POST processing unit 23 sets the value of the startup flag 27 to "0".

If the memory initializing unit 22 sets a memory mode to the independent mode, the POST processing unit 23 receives a notification indicating DIMMs included in a pair of DIMMs in which an uncorrectable error is detected in the memory test of the memory lock step mode. For example, when a memory test is carried out in the memory lock step mode, an uncorrectable error is detected from the pair of DIMMs 9b and 10b. In this case, the POST processing unit 23 receives a notification indicating the DIMMs 9b and 10b. Therefore, the POST processing unit 23 executes a memory test with respect to the DIMMs 9b and 10b in the independent mode.

An example of a memory test executed by the POST processing unit 23 will be described below. In the following example, the DIMMs 9a to 9c and 10a to 10c each have 18 4-bit DRAMs, and a DRAM included in the DIMM 9a fails and an uncorrectable error occurs.

A memory test executed by the POST processing unit 23 in the memory lock step mode will be described below. The POST processing unit 23 generates various data patterns such as data having each value of "0", data having each value of "1", and data repeating values "0" and "1". Then, the POST processing unit 23 generates a 144-bit code word encoding the generated data pattern by using an S8EC (144, 128) code. In other words, the POST processing unit 23 generates a code word stored in a plurality of DIMMs, which are operated in the memory lock step mode. Thereafter, the POST processing unit 23 writes the generated code word to each pair of DIMMs, for example, the pair of DIMMs 9a and 10a, and then, executes a read operation.

In this case, the memory controller 3 executes an error check of the read data, and stores the error check result in an ECC error status register. The POST processing unit 23 confirms the content of the ECC error status register of the memory controller 3 and determines whether or not an uncorrectable error is detected in data read from each pair of DIMMs.

Then, the POST processing unit 23 stores the determined result in the doubted DIMM specifying database 26 as the error information 28. For example, when reading data from the pair of DIMMs 9b and 10b, if an uncorrectable error is detected, the POST processing unit 23 stores error information "NG" associated with the pair of DIMMs 9b and 10b in the doubted DIMM specifying database 26. Thereafter, the POST processing unit 23 requests the analyzing unit 25 to restart.

On the other hand, when carrying out a memory test in the independent mode, the POST processing unit 23 executes the following procedure. For example, the POST processing unit 23 generates a code word encoding various data patterns by using encoding having 8-bit correcting ability, for example, a SDDC (56, 32) code. Then, the POST processing unit 23 writes the generated code word to a designated DIMM, for example, the DIMM 9b. Further, the POST processing unit 23 reads data written to the DIMM 9b to confirm the content of the ECC error status register of the memory controller 3. If an uncorrectable error is detected from data read from the DIMM 9b, the POST processing unit 23 stores error information "NG" associated with information indicating the DIMM 9b in the doubted DIMM specified result 29.

In this case, if an uncorrectable error is not detected from both of DIMMs included in a pair of DIMMs in which an uncorrectable error is detected, the POST processing unit 23 executes the following procedure. Specifically, the POST processing unit 23 stores error information "NG" associated with information indicating both of DIMMs in the doubted DIMM specified result 29.

For example, when the POST processing unit 23 is notified of the DIMMs 9b and 10b, the POST processing unit 23 executes the following procedure if an uncorrectable error is not detected from both of DIMMs. That is, the POST processing unit 23 stores error information "NG" associated with information indicating the DIMM 9b in the doubted DIMM specified result 29. Further, the POST processing unit 23 stores error information "NG" associated with information indicating the DIMM 10b in the doubted DIMM specified result 29.

The memory error processing unit 24 monitors the content of the ECC error status register of the memory controller 3. If an uncorrectable memory error is detected after an OS starts, the memory error processing unit 24 specifies a pair of DIMMs in which an uncorrectable memory error is detected. Then, the memory error processing unit 24 stores information indicating the specified pair of DIMMs and error information "NG" in the doubted DIMM specifying database 26 as the error information 28. Further, the memory error processing unit 24 updates the value of the startup flag 27 to "1", and then, requests the analyzing unit 25 to restart the information processing device 1.

For example, when the information processing device 1 is normally operating in the memory lock step mode, the memory error processing unit 24 executes the following procedure if an uncorrectable error is detected in the pair of DIMMs 9b and 10b. In other words, the memory error processing unit 24 stores the error information 28 associating information indicating the pair of DIMMs 9b and 10b with error information "NG" in the doubted DIMM specifying database 26, and updates the value of the startup flag 27 to "1". Then, the memory error processing unit 24 requests the analyzing unit 25 to restart the information processing device 1. As a result, the information processing device 1 restarts and executes a memory test with respect to each of the DIMMs 9b and 10b in the independent mode.

The analyzing unit 25 refers to the doubted DIMM specified result 29 and specifies a DIMM indicated by the information associated with error information "NG". In other words, the analyzing unit 25 specifies a DIMM in which an uncorrectable error is detected when carrying out a memory test in the independent mode. Then, the analyzing unit 25 generates system event log (SEL) point-out indicating a DIMM in which an uncorrectable error is detected, and outputs the generated SEL point-out to an output device (not illustrated), for example, a monitor or printer.

For example, FIG. 5 is a table to explain an example of SEL point-out. In the example depicted in FIG. 5, the analyzing unit 25 outputs SEL point-out in which a time stamp, kind of error, a doubted portion, and error content are associated with each other. The time stamp is information indicating time outputting SEL point-out. The kind of error is information indicating the kind of error. The doubted portion is information indicating a location in which an error is detected. The error content is information indicating the content of an occurred error.

For example, the SEL point-out depicted in FIG. 5 indicates that the following error occurs on time and date "21 Dec. 2012 22:48". In other words, the SEL point-out indicates that an uncorrectable error occurs in the DIMMs 9a and 9b included in the DDR 9 controlled by the memory controller (MC) 3. Further, the SEL point-out indicates that an uncorrectable error occurs in the DIMM 10b included in the DDR 10 controlled by the memory controller 3. When outputting the SEL point-out, the analyzing unit 25 turns off the power of the information processing device 1.

If the power is turned off due to the occurrence of uncorrectable error, a person, who is in charge of maintenance of the device, replaces an abnormal portion based on the SEL point-out outputted by the analyzing unit 25, and restarts the device so that the device is operated. In this case, in order to shorten stoppage time of a server, if an abnormal event happens, there is no time for spending on grasp and selection of fault and limitation of a doubted portion. However, the information processing device 1 is able to point out a DIMM in which a fault occurs; therefore, advantages such as instantaneous replacement and restart are provided.

When receiving a restart request from the POST processing unit 23 or the memory error processing unit 24, the analyzing unit 25 restarts the information processing device 1. Further, the analyzing unit 25 refers to the doubted DIMM specified result 29, and restarts an OS if a DIMM indicating information associated with error information "NG" does not exist.

Figure 6:
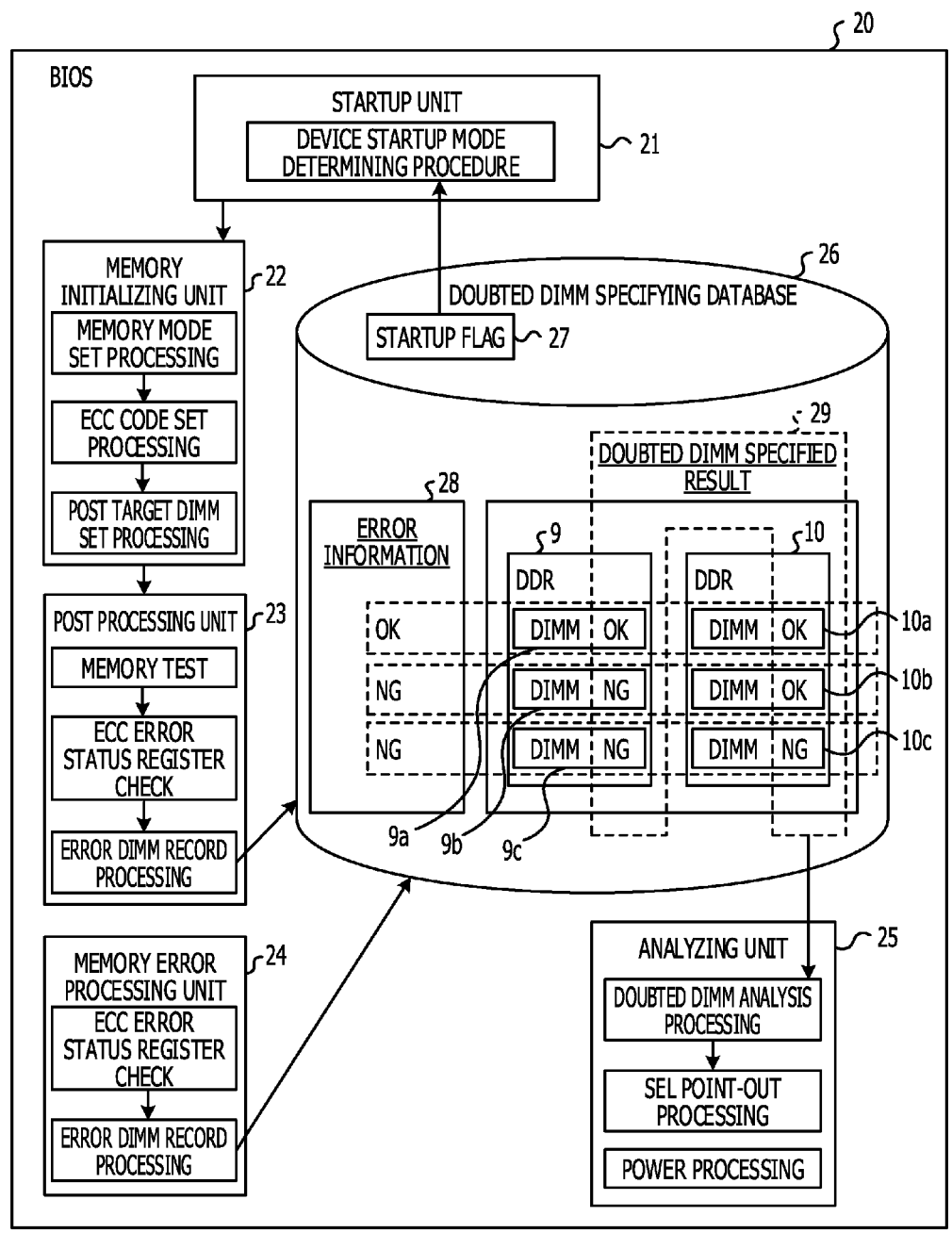
FIG. 6 is a diagram to explain a procedure executed by a BIOS.

With reference to FIG. 6, the flow of procedure executed by the BIOS 20 will be described below. FIG. 6 is a diagram to explain the procedure executed by BIOS. In the example described below, the DIMMs 9a, 10a, and 10b are normal while the DIMMs 9b, 9c, and 10c fail.

When the power of the information processing device 1 is turned on, the startup unit 21 confirms the startup flag 27, and executes a device startup mode determining procedure of selecting a memory mode. Then, the startup unit 21 informs the memory initializing unit 22 of the result of the device startup mode determining procedure.

The memory initializing unit 22 executes memory mode set processing for setting a memory mode selected by the startup unit 21. Then, the memory initializing unit 22 executes ECC code set processing for setting the ECC function of the memory controller 3 according to the set memory mode. Further, the memory initializing unit 22 executes POST target DIMM set processing for notifying the POST processing unit 23 of a DIMM, which is an error check target, based on a memory mode and the error information 28.

The POST processing unit 23 carries out a memory test with respect to the DIMM notified from the memory initializing unit 22 in a memory mode set by the memory initializing unit 22. The memory test is carried out, and thereafter, the POST processing unit 23 checks an ECC error status register of the memory controller 3. Then, the POST processing unit 23 executes error DIMM record processing for storing a pair of DIMMs in which an uncorrectable error is detected or information indicating a DIMM in the doubted DIMM specifying database 26.

For example, the POST processing unit 23 carries out a memory test in the memory lock step mode with respect to each of the pair of DIMMs 9a and 10a, the pair of DIMMs 9b and 10b, and the pair of DIMMs 9c and 10c. In such a case, the POST processing unit 23 detects an uncorrectable error in the pair of DIMMs 9b and 10b and the pair of DIMMs 9c and 10c.

As a result, the POST processing unit 23 stores error information "OK" associated with a pair of DIMMs 9a and 10a in the doubted DIMM specifying database 26, as depicted in FIG. 6. Further, the POST processing unit 23 stores error information "NG" associated with a pair of DIMMs 9b and 10b and a pair of DIMMs 9c and 10c in the doubted DIMM specifying database 26, as depicted in FIG. 6.

After restart, the POST processing unit 23 carries out a memory test with respect to each of the DIMMs 9b, 10b, 9c, and 10c in the independent mode. As a result, the POST processing unit 23 detects an uncorrectable error in the DIMMs 9b, 9c, and 10c.

Therefore, the POST processing unit 23 stores the doubted DIMM specified result 29 associating information indicating the DIMMs 9a, 10a, and 10b with error information "OK" in the doubted DIMM specifying database 26. Further, the POST processing unit 23 stores the doubted DIMM specified result 29 associating information indicating DIMMs 9b, 9c, and 10c with error information "NG" in the doubted DIMM specifying database 26.

On the other hand, the memory error processing unit 24 checks an ECC error status register of the memory controller 3 after an OS starts. Then, the memory error processing unit 24 executes error DIMM record processing if an uncorrectable error is detected. In other words, the memory error processing unit 24 stores the error information 28 associating information indicating a pair of DIMMs in which an uncorrectable error is detected with error information "NG" in the doubted DIMM specifying database 26, and then, sets the startup flag 27 to "1".

The analyzing unit 25 executes doubted DIMM analysis processing for analyzing the doubted DIMM specified result 29 to specify the DIMMs 9b, 9c, and 10c in which an uncorrectable error is detected. Then, the analyzing unit 25 executes SEL point-out processing for outputting SEL point-out indicating the DIMMs 9b, 9c, and 10c in which an uncorrectable error is detected. Thereafter, the analyzing unit 25 turns off the power of the information processing device 1.

As described above, when carrying out a memory test in the memory lock step mode, the information processing device 1 stores the startup flag 27 indicating that an uncorrectable error is detected in the NVRAM 8. If the startup flag 27 indicating that an uncorrectable error is detected is stored in the NVRAM 8 at the startup time, the information processing device 1 carries out a memory test in the independent mode. As a result, the information processing device 1 is able to specify a DIMM in which an uncorrectable error occurs.

Figure 7:
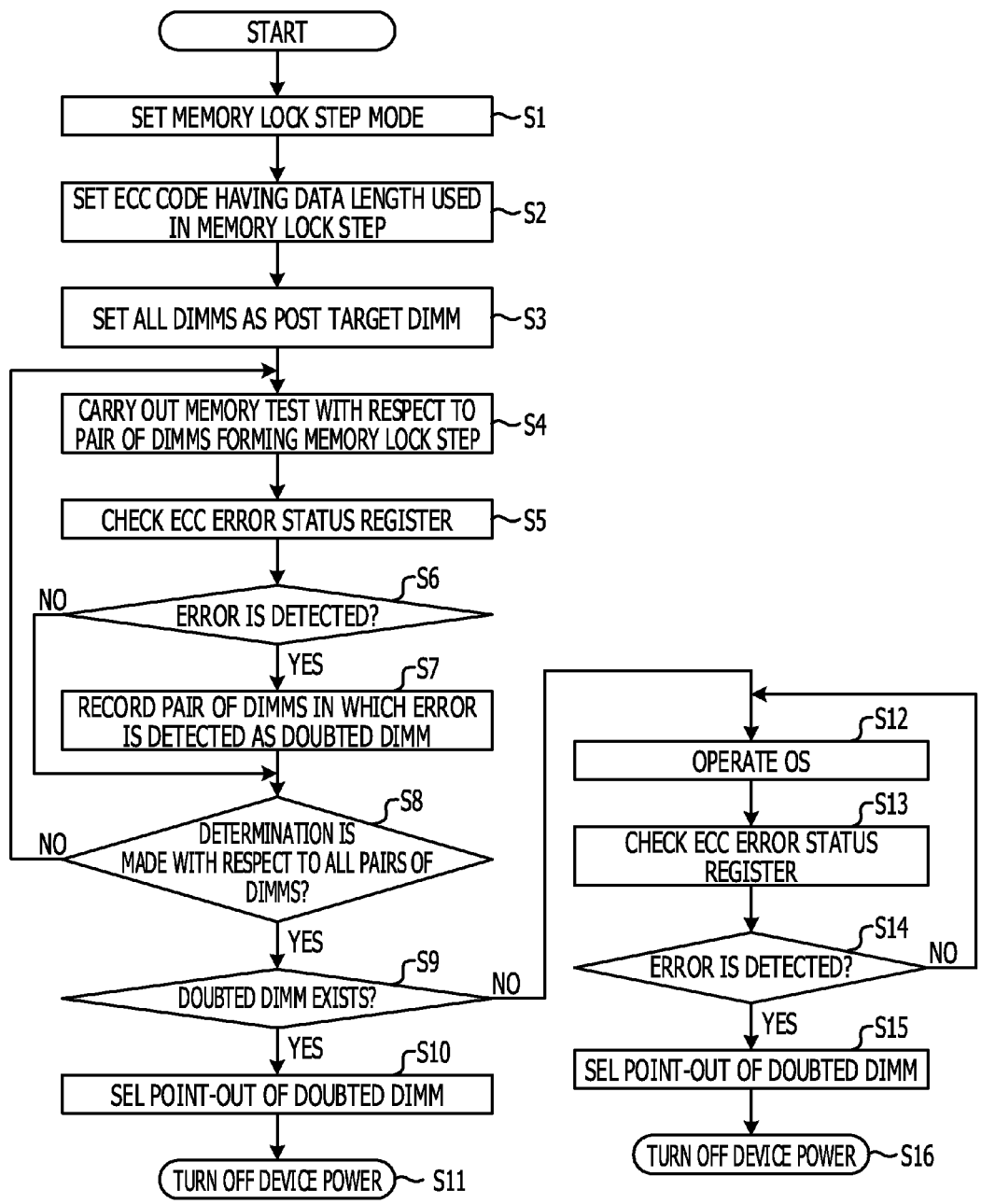
FIG. 7 is a flowchart to explain a memory error process executed by an information processing device according to the related art.

The flow of a procedure executed by an information processing device according to the related art will be described below. FIG. 7 is a flowchart to explain a memory error procedure by the information processing device according to the related art.

As illustrated in FIG. 7, the information processing device according to the related art sets a memory mode to a memory lock step mode (step S1), and then, sets an ECC code having a data length used in a memory lock step (step S2). Then, the information processing device sets all pairs of DIMMs as a POST target DIMM (step S3), and then, carries out a memory test with respect to pairs of DIMMs forming the memory lock step (step S4). Further, the information processing device checks an ECC error status register (step S5) to determine whether or not an error is detected (step S6).

If an uncorrectable error is detected (Yes in step S6), the information processing device records each DIMM included in the detected pair of DIMMs as a doubted DIMM (step S7). If an uncorrectable error is not detected (No in step S6), the information processing device skips the processing of step S7. Further, the information processing device determines whether or not a memory test is carried out with respect to all pairs of DIMMs (step S8). If the memory test is not carried out with respect to all pairs of DIMMs (No in step S8), the information processing device executes the processing of step S4.

If a memory test is carried out with respect to all pairs of DIMMs (Yes in step S8), the information processing device determines whether or not a doubted DIMM is recorded (step S9). If the doubted DIMM is recorded (Yes in step S9), the information processing device outputs SEL point-out indicating the doubted DIMM (step S10), and then, turns off the device power (step S11).

Conversely, if the doubted DIMM is not recorded (No in step S9), the information processing device operates an OS (step S12). Thereafter, the information processing device checks an ECC error status register (step S13) to determine whether or not an uncorrectable error is detected (step S14). If an uncorrectable error is detected (Yes in step S14), the information processing device outputs SEL point-out indicating a doubted DIMM (step S15), and turns off the device power (step S16). If an uncorrectable error is not detected (No in step S14), the information processing device executes the processing of step S12.

As described above, the information processing device according to the related art makes SEL point-out with respect to a pair of DIMMs in which an uncorrectable error is detected, of pairs of DIMMs operating in the memory lock step mode. However, the information processing device according to the related art is not able to make SEL point-out specifying a DIMM in which an uncorrectable error is detected. For this reason, the information processing device is not able to grasp and select a fault, such as failed DIMMs.

Figure 8A:
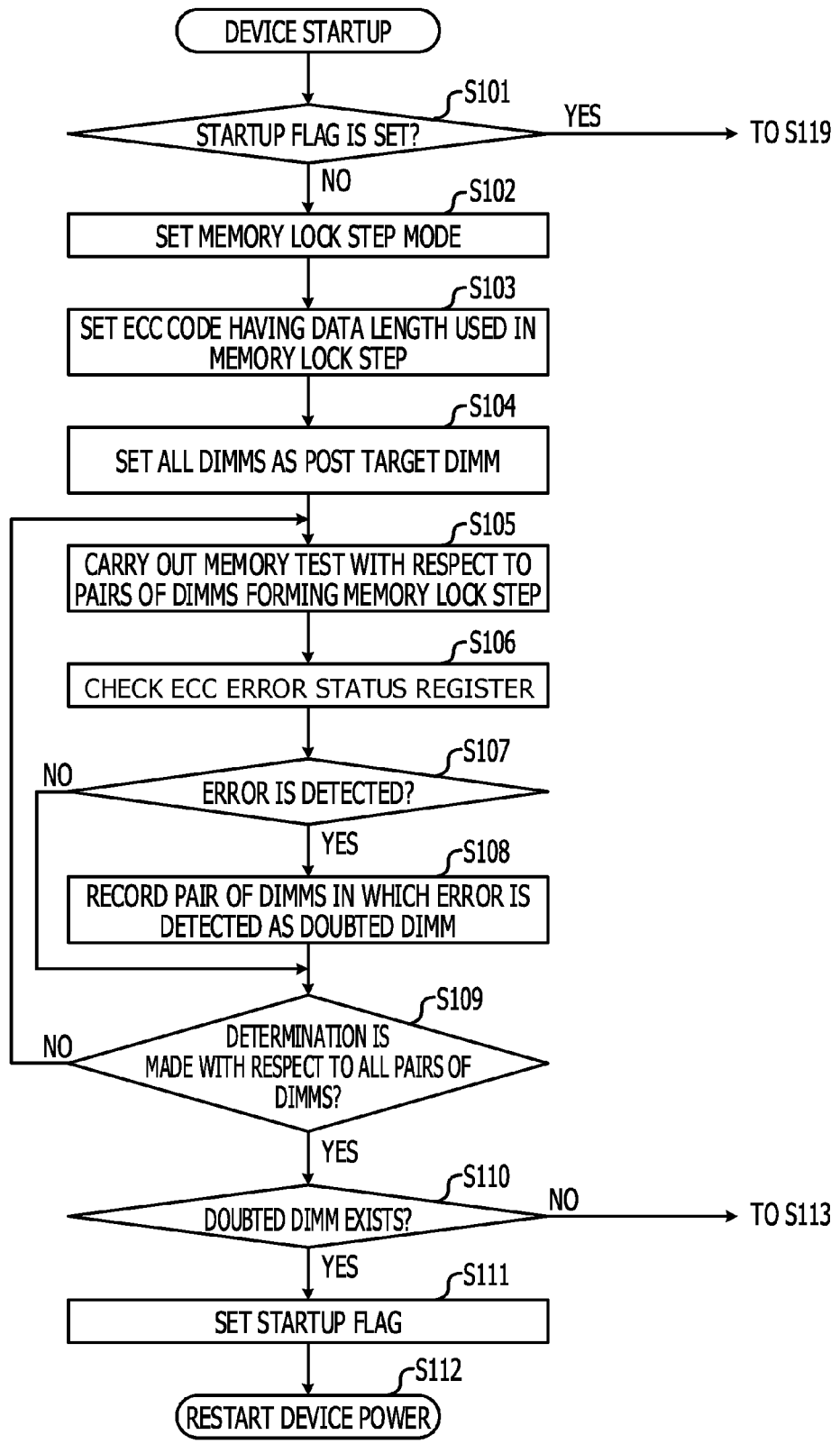
FIGS. 8A, 8B and 8C illustrate a flowchart to explain a flow of a memory error process executed by a BIOS.
Figure 8B:
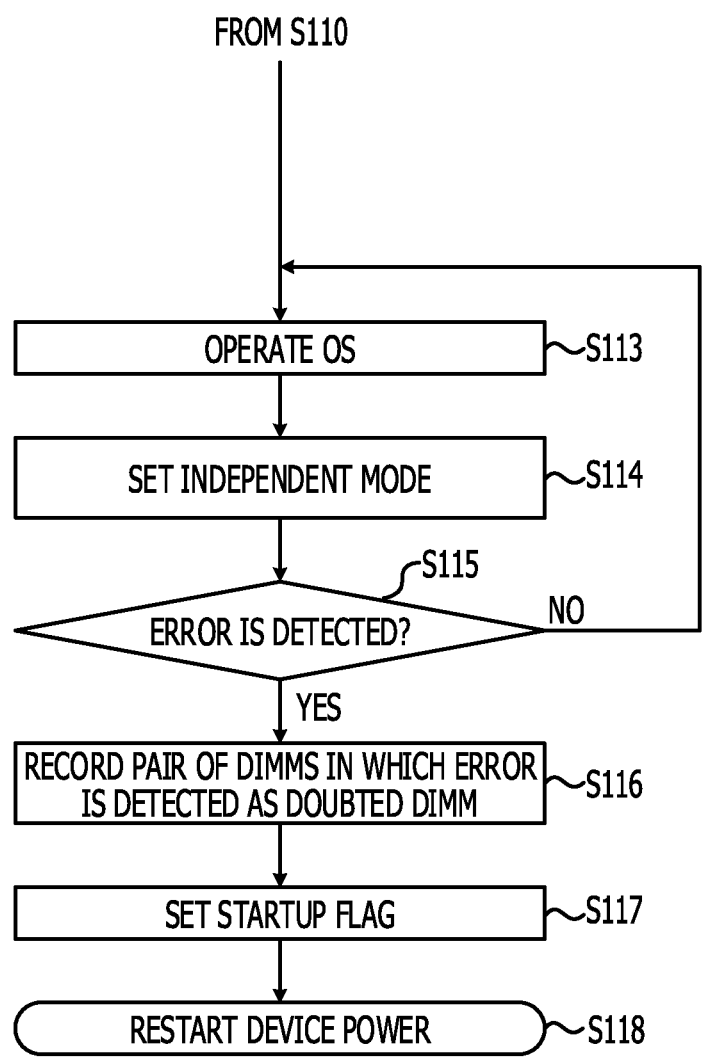
Figure 8C:
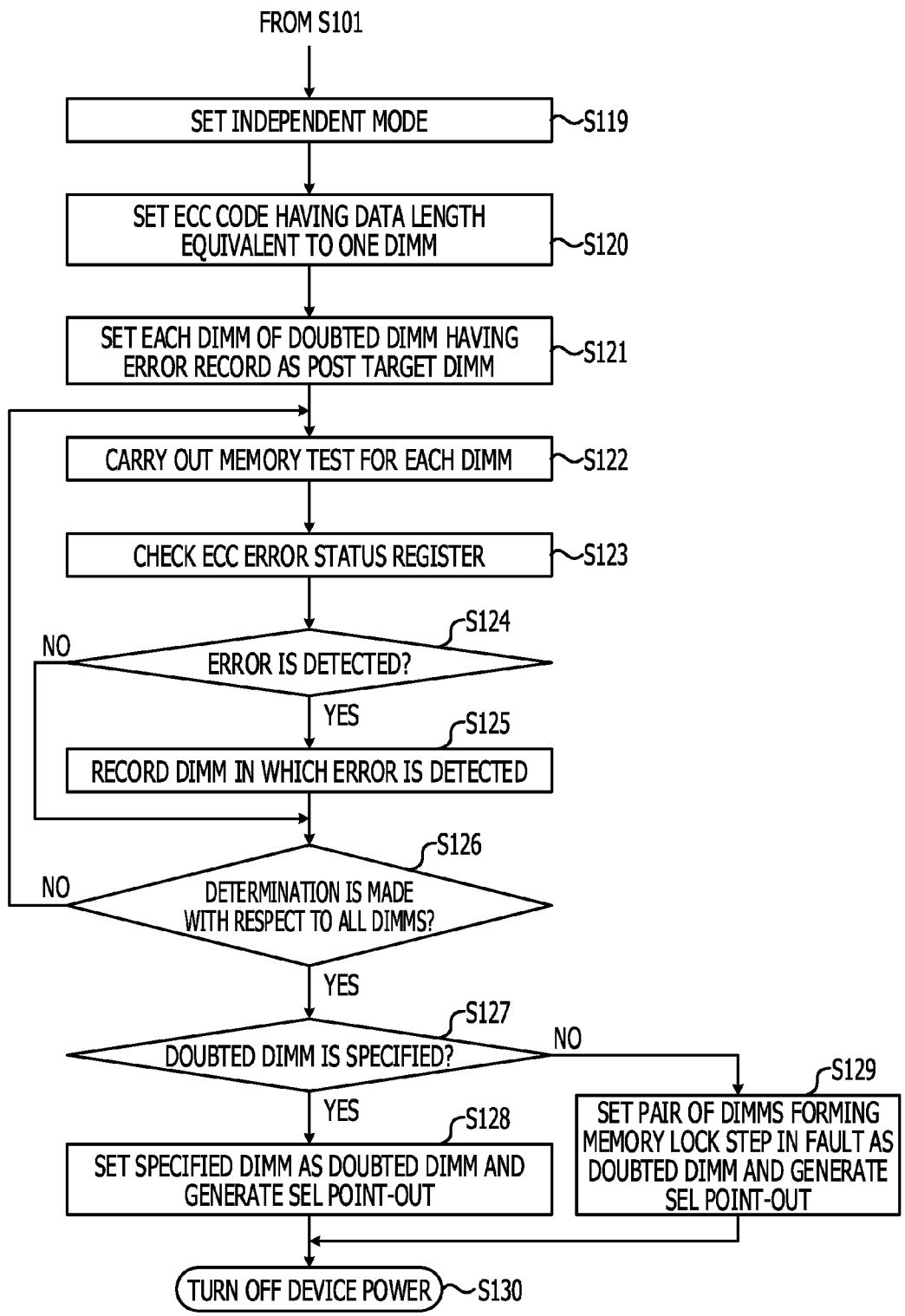

With reference to FIG. 8, the flow of the procedure executed by the information processing device 1 executing the BIOS 20 will be described below. FIG. 8 is a flowchart to explain the flow of a memory error procedure executed by BIOS. In the following description, the explanations of steps S103 to S110 and S113 to S115 depicted in FIG. 8 are omitted because they are the same as steps S2 to S9 and S12 to S14 illustrated in FIG. 7.

For example, when starting, the information processing device 1 determines whether or not a startup flag is set (step S101). If the startup flag is not set (No in step S101), the information processing device 1 sets a memory mode to a memory lock step mode (step S102). Further, the information processing device 1 executes the processes from steps S102 to S109, and thereby, records a DIMM included in a pair of DIMMs in which an uncorrectable error is detected, that is, a doubted DIMM. If the doubted DIMM is recorded (Yes in step S110), the information processing device 1 sets the startup flag 27 to "1" (step S111), and restarts (step S112).

If the doubted DIMM is not recorded (No in step S110), the information processing device 1 operates an OS (step S113). If an uncorrectable error is detected (Yes in step S115), the information processing device 1 records a pair of DIMMs in which an uncorrectable error is detected, as a doubted DIMM (step S116). Then, the information processing device 1 sets the startup flag 27 to "1" (step S117), and restarts (step S118).

If the startup flag is set (Yes in step S101), that is, if an uncorrectable error is detected in the memory lock step mode, the information processing device 1 sets a memory mode to an independent mode (step S119). Next, the information processing device 1 sets an ECC code having a data length equivalent to one DIMM (step S120). Then, the information processing device 1 sets each DIMM included in the doubted DIMM recorded as a POST target DIMM (step S121). Thereafter, the information processing device 1 carries out a memory test for each DIMM (step S122).

The information processing device 1 checks an ECC error status register (step S123), and then, determines whether or not an uncorrectable error is detected (step S124). If an uncorrectable error is detected (Yes in step S124), the information processing device 1 records a DIMM in which an uncorrectable error is detected (step S125). Further, the information processing device 1 determines whether or not a memory test is carried out with respect to all DIMMs of POST target (step S126). If the memory test is not carried out with respect to all DIMMs of POST target (No in step S126), the information processing device 1 executes the processing of step S122.

If the memory test is carried out with respect to all DIMMs of POST target (Yes in step S126), the information processing device 1 determines whether or not a doubted DIMM is specified (step S127). In other words, the information processing device 1 determines whether or not an uncorrectable error is detected in either or both of doubted DIMMs, which makes a pair when operating in the memory lock step mode.

If a doubted DIMM is specified (Yes in step S127), the information processing device 1 sets the specified DIMM as a doubted DIMM, and generates SEL point-out (step 128), and thereafter, turns off the device power (step S130). If a doubted DIMM is not specified (No in step S127), the information processing device 1 executes the following processing. Namely, the information processing device 1 sets DIMMs included in a pair of DIMMs forming a memory lock step in fault as a doubted DIMM, and generates SEL point-out (step S129), and thereafter, turns off the device power (step S130).

As described above, the information processing device 1 carries out a test whether or not an uncorrectable error is detected in the memory lock step mode of concurrently operating a plurality of DIMMs. If an uncorrectable error is detected, the information processing device 1 sets the startup flag 27 indicating that an uncorrectable error is detected in the NVRAM 8, which is a non-volatile memory. If the startup flag 27 indicating that an uncorrectable error is detected is set in restart, the information processing device 1 carries out a test whether or not an uncorrectable error is detected in the independent mode of individually operating a plurality of DIMMs. Thereafter, the information processing device 1 outputs the test result carried out in an independent mode as SEL point-out.

Therefore, even if each of the DIMMs 9a to 9c, 10a to 10c, 11a to 11c, and 12a to 12c is operated in the memory lock step mode, the information processing device 1 is able to specify the DIMM in which an uncorrectable error has occurred. As a result, the information processing device 1 is capable of quickly reproducing fault and grasping and selecting the DIMM having occurrence of fault without changing an environment, structure, and the like in which fault occurs. In addition, the information processing device 1 is able to specify a failed DIMM. Therefore, this serves to improve reproducibility when, for example, reproducing the condition that fault occurs in another environment.

Further, the information processing device 1 stores in the NVRAM 8 the error information 28 indicating a pair of DIMMs in which an uncorrectable error is detected, of pairs of DIMMs operated in the memory lock step mode. The information processing device 1 operates, in the independent mode, a DIMM included in a pair of DIMMs in which an uncorrectable error is detected, of pairs of DIMMs operated in the memory lock step mode, and then, carries out a memory test. Therefore, the information processing device 1 is able to quickly specify a failed DIMM.

When carrying out a memory test with respect to each DIMM included in a pair of DIMMs in which an uncorrectable error is detected in the memory lock step mode, in the independent mode, the information processing device 1 generates SEL point-out of each DIMM if an uncorrectable error is not detected. In other words, when carrying out a memory test with respect to a pair of DIMMs in which an uncorrectable error occurs in the memory lock step mode, in the independent mode, the information processing device 1 generates SEL point-out of each DIMM if an uncorrectable error is not reproduced.

Therefore, the information processing device 1 is able to specify a DIMM having a possibility of failure. In other words, the information processing device 1 is able to specify an abnormal product in which an error is not reproduced due to an environment. As a result, the information processing device 1 is able to reduce the number of processes of carrying out reproduction and investigation for clarifying the cause of error.

Further, the information processing device 1 generates SEL point-out for a DIMM in which an error is detected when being operated in the memory lock step mode. Therefore, the information processing device 1 is able to point out a failed DIMM for a user.

Embodiment 2

The embodiment of the present disclosure described so far may be embodied according to various modes other than the foregoing embodiment. Hereinafter, another embodiment included in the present disclosure will be described as the embodiment 2.

The foregoing information processing device 1 carries out a memory test with respect to each DIMM included in a pair of DIMMs in which an uncorrectable error is detected in a memory lock step mode, in an independent mode. However, this embodiment is not limited to the above. For example, if an uncorrectable error is detected in the memory lock step mode, the information processing device 1 sets the startup flag 27 to "1" without generating the error information 28, and then, restarts. If the startup flag 27 is "1" at startup, the information processing device 1 may carry out a memory test with respect to each of the DIMMs 9a to 9c, 10a to 10c, 11a to 11c, and 12a to 12c in the independent mode.

In other words, the information processing device 1 may not store a pair of DIMMs in which an uncorrectable error is detected in a memory lock step mode so long as the information processing device 1 stores the startup flag 27 indicating that an uncorrectable error is detected in the memory lock step mode in a non-volatile storage area. As a result, the information processing device 1 is able to specify a failed DIMM without storing a pair of DIMMs in which an uncorrectable error is detected in the memory lock step mode.

According to the foregoing embodiment 1, the CPU 2 executes the BIOS 20 to exhibit the functions of the startup unit 21, the memory initializing unit 22, the POST processing unit 23, the memory error processing unit 24, and the analyzing unit 25. However, this embodiment is not limited to the above; for example, the information processing device 1 may be provided with a micro-processing unit (MPU), which exhibits the same function as the BIOS 20 and an application specific integrated circuit (ASIC). Further, after an OS starts, if the OS controls various resources of the information processing device 1, the OS may execute the procedure executed by the memory error processing unit 24.

For simplification of explanation, according to the foregoing embodiment 1, the BIOS 20 carries out a memory test with respect to the DIMMs 9a to 9c and 10a to 10c included in the DDRs 9 and 10 via the memory controller 3. In this case, the BIOS 20 executes the same procedure, and thereby, carries out a memory test with respect to the DIMMs 11a to 11c and 12a to 12c included in the DDRs 11 and 12 via the memory controller 4. As a result, the information processing device 1 is able to specify a failed DIMM from all DIMMs 9a to 9c, 10a to 10c, 11a to 11c, and 12a to 12c.

The foregoing information processing device 1 generates a code word using S8EC (144, 128) code in a memory lock step mode while generating a code word using SDDC (56, 32) code in the independent mode. However, this embodiment is not limited to the above; the information processing device 1 is able to use a code word having an arbitrary correcting ability.

Further, the information processing device 1 may use a code word having only detecting ability without having an error correcting ability. For example, the information processing device 1 may use automatic repeat request (ARQ) of correcting an error byte by specifying a byte in which an error occurs using an error detecting code and by executing retry using different data. Further, the information processing device 1 may use forward error correction (FEC) of correcting an error on the receiver side.

When operating DIMMs in the memory lock step mode, the foregoing information processing device 1 concurrently operates two DIMMs, for example, the DIMMs 9a and 10a. However, this embodiment is not limited to the above. For example, the information processing device 1 may concurrently operate four DIMMs 9a, 9b, 10a, and 10b. In such a case, the information processing device 1 generates a code word stored in four DIMMs 9a, 9b, 10a, and 10b, and then, stores the generated code word in each of four DIMMs 9a, 9b, 10a, and 10b.

The BIOS 20 described in the embodiment 1 is realizable by executing a prepared program by a personal computer or a computer such as workstation. This program is distributed via a network such as Internet. Further, this program is recorded to a computer-readable recording medium such as hard disk, flexible disk (FD), compact disc read only memory (CD-ROM), magneto optical disc (MO), and digital versatile disc (DVD). Furthermore, this program is executable by being read from a recording medium by a computer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing device comprising:
a plurality of memories; and
a processor coupled to the plurality of memories and configured to:
carry out a first test to determine whether a first error is detected in a first pair including first and second memories of the plurality of memories when the first and second memories are concurrently operated, and
when the first error is detected from the first test, carry out a second test to determine whether a second error is detected in the first memory or the second memory or both the first and the second memories when the first and second memories are separately operated, wherein
the first memory has a first bit width and the second memory has a second bit width, and in the first test, the processor is configured to:
store, in the first pair, a first code word that includes first data and a first code for error detection, the first code word having a third bit width equal to a sum of the first bit width and the second bit width, read out the first code word from the first pair, and carry out the first test for the first data using the first code.

2. The information processing device according to claim 1, further comprising:
a non-volatile memory; wherein
the processor is configured to store a flag indicating that the first error is detected in the first test, in the non-volatile memory.

3. The information processing device according to claim 2, wherein
the processor is configured to
determine whether the flag is stored in the non-volatile memory when the processor starts up, and
carry out the second test when the processor determines that the flag is stored in the non-volatile memory.

4. The information processing device according to claim 1, wherein
the processor is configured to correct an error included in output data from the plurality of memories, and
the first and second errors are uncorrectable by the processor.

5. The information processing device according to claim 1, wherein
the first and second errors are uncorrectable by the processor.

6. The information processing device according to claim 1, wherein
the plurality of memories includes a second pair including third and fourth memories, the third and fourth memories concurrently operate in the first test, and the processor is configured to store in a non-volatile memory, first error information indicating which of the first pair including the first and second memories and the second pair including the third and fourth memories, has the first error when the first error is detected, and separately operate a plurality of memories included in the first or second pair indicated by the first error information to determine whether the second error is detected in the second test.

7. The information processing device according to claim 6, wherein, when the second error is not detected from a plurality of memories included in the first or second pair indicated by the first error information, the processor is configured to output a second error information indicating that the second error is detected from each of the memories included in the first or second pair.

8. The information processing device according to claim 1, wherein the processor is configured to specify which of the first and second memories has caused the second error.

9. The information processing device according to claim 1, wherein in the first test, the first and second memories are operated in a lock step mode, and in the second test, the first and second memories are operated in an independent mode.

10. The information processing device according to claim 1, wherein in the second test, the processor is configured to store, in the first memory, a second code word including a second data and a second code for error detection, the second code word having the first bit width, store, in the second memory, a third code word including a third data and a third code for error detection, the third code word having the second bit width, read out the second code word from the first memory, read out the third code word from the second memory, carry out the second test for each of the second data and the third data using the second code and the third code, respectively.

11. A non-transitory computer-readable recoding medium storing a program for causing a computer including a plurality of memories and a processor coupled to the plurality of memories to execute a process, the plurality of memories including a first pair of first and second memories, the first memory having a first bit width and the second memory having a second bit width, the process comprising:

storing, in the first pair, a first code word that includes first data and a first code for error detection, the first code word having a third bit width equal to a sum of the first bit width and the second bit width;

reading out the first code word from the first pair;

carrying out a first test for the first data using the first code to determine whether a first error is detected in the first pair including the first and second memories of the plurality of memories when the first and second memories of the plurality of memories are concurrently operated; and when the first error is detected from the first test, carrying out a second test to determine whether a second error is detected in the first memory or the second memory or both the first and second memories when the first and second memories are separately operated.

12. The non-transitory computer-readable recoding medium according to claim 11, the process further comprising:

storing a flag indicating that the first error is detected in the first test in a non-volatile memory, determining whether the flag is stored in the non-volatile memory when the processor starts up, and carrying out the second test when the processor determines that the flag is stored in the non-volatile memory.

13. The non-transitory computer-readable recoding medium according to claim 11, the process further comprising:

storing, in the first memory, a second code word including a second data and a second code for error detection, the second code word having the first bit width;

storing, in the second memory, a third code word including a third data and a third code for error detection, the third code word having the second bit width;

reading out the second code word from the first memory; and reading out the third code word from the second memory; wherein in the carrying out of the second test, the second test is carried out for each of the second data and the third data using the second code and the third code, respectively.

14. A method executed by a computer including a plurality of memories and a processor coupled to the plurality of memories, the plurality of memories including a first pair of first and second memories, the first memory having a first bit width and the second memory having a second bit width, the method comprising:

storing, in the first pair, a first code word that includes first data and a first code for error detection, the first code word having a third bit width equal to a sum of the first bit width and the second bit width;

reading out the first code word from the first pair;

carrying out a first test for the first data using the first code to determine whether a first error is detected in a first pair including first and second memories of the plurality of memories when the first and second memories of the plurality of memories are concurrently operated; and when the first error is detected from the first test, carrying out a second test to determine whether a second error is detected in the first memory or the second memory or both the first and second memories when the first and second memories are separately operated.

15. The method according to claim 14, the method further comprising:

storing a flag indicating that the first error is detected in the first test, in a non-volatile memory;

determining whether the flag is stored in the non-volatile memory when the processor starts up; and carrying out the second test when the processor determines that the flag is stored in the non-volatile memory.

16. The method according to claim 14, the method further comprising:

storing, in the first memory, a second code word including a second data and a second code for error detection, the second code word having the first bit width;

storing, in the second memory, a third code word including a third data and a third code for error detection, the third code word having the second bit width;

reading out the second code word from the first memory; and reading out the third code word from the second memory; wherein in the carrying out of the second test, the second test is carried out for each of the second data and the third data using the second code and the third code, respectively.

* * * * *